(12) United States Patent
Okamoto et al.

(10) Patent No.: US 7,402,452 B2
(45) Date of Patent: Jul. 22, 2008

(54) GATE OXIDE FILM STRUCTURE FOR A SOLID STATE IMAGE PICK-UP DEVICE

(75) Inventors: Eiichi Okamoto, Miyagi (JP); Shunsuke Tanaka, Miyagi (JP); Shinji Uya, Miyagi (JP)

(73) Assignee: FUJIFILM Corporation, Tokyo (JP)

( * ) Notice: Subject to any disclaimer, the term of this patent is extended or adjusted under 35 U.S.C. 154(b) by 346 days.

(21) Appl. No.: 11/187,937

(22) Filed: Jul. 25, 2005

(65) Prior Publication Data

US 2005/0260785 A1    Nov. 24, 2005

Related U.S. Application Data

(62) Division of application No. 10/438,865, filed on May 16, 2003, now Pat. No. 6,946,694.

(30) Foreign Application Priority Data

May 16, 2002    (JP) ............ P. 2002-141736

(51) Int. Cl.
*H01L 21/00* (2006.01)

(52) U.S. Cl. .................................. 438/60; 438/75

(58) Field of Classification Search ............ 438/60, 438/75, 287, 724, 739, 744, 757
See application file for complete search history.

(56) References Cited

U.S. PATENT DOCUMENTS

| 5,581,099 A | 12/1996 | Kusaka et al. |
| 5,699,114 A | 12/1997 | Park |
| 6,133,595 A | 10/2000 | Senda |
| 6,946,694 B2 * | 9/2005 | Okamoto et al. ............ 257/222 |

FOREIGN PATENT DOCUMENTS

| JP | HEI.6-151804 A | 5/1994 |
| JP | HEI 11-45989 A | 2/1999 |
| JP | 2000-286407 A | 10/2000 |

* cited by examiner

*Primary Examiner*—Mark V. Prenty
(74) *Attorney, Agent, or Firm*—Birch, Stewart, Kolasch & Birch, LLP

(57) ABSTRACT

In a solid-state image pick-up device in which a photoelectric converting section formed on a semiconductor substrate and a gate oxide film of a transfer path of a charge coupled device (CCD) which is close to the photoelectric converting section are constituted by a laminated film comprising a silicon oxide film (SiO) and a silicon nitride film (SiN), the gas oxide film has a single layer structure in which at least an end on the photoelectric converting section side of the gate oxide film does not contain the silicon nitride film.

10 Claims, 6 Drawing Sheets

GATE OXIDE FILM STRUCTURE FOR A SOLID STATE IMAGE PICK-UP DEVICE

This application is a Divisional of application Ser. No. 10/438,865, filed on May 16, 2003, now U.S. Pat. No. 6,946,694, the entire contents of which are hereby incorporated by reference and for which priority is claimed under 35 U.S.C. § 120.

BACKGROUND OF THE INVENTION

1. Field of the Invention

The present invention relates to a solid-state image pick-up device and a method of manufacturing the solid-state image pick-up device, and more particularly to a solid-state image pick-up device having a structure in which a gate oxide film includes a silicon nitride film and a method of manufacturing the solid-state image pick-up device.

2. Description of the Related Art

In a solid-state image pick-up device in related arts, as shown in an example of a sectional structure in FIG. 7, a photodiode section and a charge transfer section are formed in a p well 11 provided on the surface of a semiconductor substrate 10, and electric charges generated in the photodiode section are led to a transfer channel comprising an n-type impurity region 14 by applying a voltage to the charge transfer electrode of the charge transfer section, and are sequentially read. In the charge transfer section, the electric charges generated in the photodiode section are led to the transfer channel comprising the n-type impurity region 14, and a gate electrode 18 to be a charge transfer electrode and reading electrode (hereinafter referred to as a reading electrode) is formed through a gate oxide film having a three-layer structure including a silicon oxide film 15, a silicon nitride film 16 and a silicon oxide film 17 on the n-type impurity region 14.

Thus, the gate oxide film provided under the reading electrode of the solid-state image pick-up device has a so-called ONO structure in which a silicon nitride film to be a gate having a high breakdown voltage is interposed between silicon oxide films. With this structure, a thin gate oxide film having a high breakdown voltage is essential in the solid-state image pick-up device which is thin and is more microfabricated recently. The ONO structure is essential to a reduction in the thickness of a gate film.

In the solid-state image pick-up device having such a structure, when a light is incident on a pixel section, it is photoelectrically converted in an n-type impurity region 12 so that a signal charge a is generated and is moved to the transfer channel 14 when a reading pulse is applied to the gate electrode 18 to be the charge transfer electrode and reading electrode. On the other hand, a signal charge by generated in the vicinity of the surface of the substrate is accelerated by an electric field through the reading pulse, and a part thereof is changed into a hot electron and is trapped into the silicon nitride film, thereby causing the aging of a reading gate voltage.

With the advance of the microfabrication of the device, the impurity concentration of the n-type impurity region 12 tends to be increased due to a reduction in a resistance so that the convergence of an electric field is more increased on the end of the reading electrode. Moreover, since a gate length is reduced, the number of collisions of an electron is decreased so that the frequency of the generation of the hot electron tends to be increased. Consequently, the aging of a voltage to be applied to the reading gate has become a serious problem.

In the such a solid-state image pick-up device, thus, there is a problem in that a gate structure which has a high breakdown voltage and can have a thickness reduced and a gate structure in which aging is not generated by a hot electron have a trade-off relationship and both of them cannot be satisfied at the same time.

SUMMARY OF THE INVENTION

In consideration of the actual circumstances, it is an object of the invention to provide a thin solid-state image pick-up device having a stability, a high reliability and a high breakdown voltage without generating aging by a hot electron.

Moreover, it is another object of the invention to provide a method of manufacturing a solid-state image pick-up device which can easily be manufactured and has a high reliability.

[Means for Solving the Problems]

The invention provides a solid-state image pick-up device in which a photoelectric converting section formed on a semiconductor substrate and a gate oxide film of a transfer path of a charge coupled device (CCD) which is close to the photoelectric converting section are constituted by a laminated film comprising a silicon oxide film (SiO) and a silicon nitride film (SiN), wherein at least an end on the photoelectric converting section side of the gate oxide film does not contain the silicon nitride film.

According to such a structure, the gate oxide film of the transfer path of the charge coupled device (CCD) which is close to the photoelectric converting section does not contain the silicon nitride film on the end at the photoelectric converting section side. The silicon nitride film is not present on the end of the electrode on which an electric field converges most greatly in the application of a reading pulse. Even if a signal charge generated in the vicinity of the surface of the substrate is changed into a hot electron, consequently, it is possible to lessen a trap as compared with the structure in which the silicon nitride film is included. Accordingly, it is possible to maintain an excellent reading characteristic without causing the aging of a voltage to be applied to a reading gate.

It is desirable that the laminated film should be a film having an ONO structure in which a silicon nitride film (SiN) is provided in a silicon oxide film (SiO). By using the film having the ONO structure, it is possible to constitute a gate oxide film which is thin and has a high breakdown voltage, and the gate oxide film of the transfer path has a single layer structure in which the silicon nitride film is not contained on the end at the photoelectric converting section side. Therefore, the hot electron is less trapped into the silicon nitride film.

Moreover, it is desirable that the gate oxide film in a region which does not contain the silicon nitride film should have a width of 0.2 μm or less. The silicon nitride film is not present in a region in which the hot electron is easily stored. Consequently, the hot electron can be prevented from being trapped. On the other hand, in some cases in which the width of 0.2 μm is exceeded, a breakdown voltage becomes insufficient.

It is desirable that the photoelectric converting section should be constituted by a photodiode, the transfer path should have a reading gate electrode which is close to the photodiode and a transfer electrode which is close to the reading gate and is independent, and an end of the silicon nitride film provided under the reading gate electrode should be positioned inward from an end of the reading gate electrode.

Also in the case in which the reading gate and the charge transfer electrode are provided independently, thus, the end of the silicon nitride film provided under the reading gate electrode is more retreated than the end of the reading gate electrode. Consequently, the hot electron can be prevented from being trapped and the breakdown voltage can also be maintained sufficiently.

Moreover, it is desirable that the gate oxide film provided under the reading gate electrode should have a single layer structure. Consequently, the silicon nitride film is completely removed under the reading gate electrode. Consequently, the hot electron is not trapped at all.

Furthermore, the invention provides a method of manufacturing a solid-state image pick-up device, comprising the steps of forming a gate oxide film having a lamination structure including at least a silicon nitride film and a silicon oxide film on an insulating film of a surface of a semiconductor substrate, forming a charge transfer electrode on the gate oxide film, etching the gate oxide film by using the charge transfer electrode as a mask, and carrying out etching on an etching condition that an etching selective ratio of the silicon nitride film to the silicon oxide film is high, thereby selectively removing an end of the silicon nitride film after the etching step.

According to such a structure, the charge transfer electrode is subjected to patterning and the gate oxide film is then subjected to the patterning by using the charge transfer electrode as a mask. Consequently, a gate oxide film from which the silicon nitride film is removed at the end can easily be formed without requiring an advanced lithographic technique. Accordingly, it is possible to provide a solid-state image pick-up device which has a high breakdown voltage and does not cause aging by a hot electron.

It is desirable that the selective removing step should be a chemical dry etching (CDE) step. Consequently, it is possible to easily remove the silicon nitride film with a high controllability.

Moreover, it is desirable that the selective removing step should be an isotropic etching step using phosphoric acid. Consequently, it is possible to easily remove the silicon nitride film without a high controllability.

Furthermore, it is desirable that the silicon nitride film should be removed and the oxidizing step should be then carried out. Consequently, the region from which the silicon nitride is removed is covered with the silicon oxide film. Thus, a solid-state image pick-up device having a high reliability can be formed very easily.

DESCRIPTION OF THE PREFERRED EMBODIMENTS

Mode for Carrying Out the Invention

Embodiments of the invention will be described below with reference to the drawings.

First Embodiment

Figure 1:
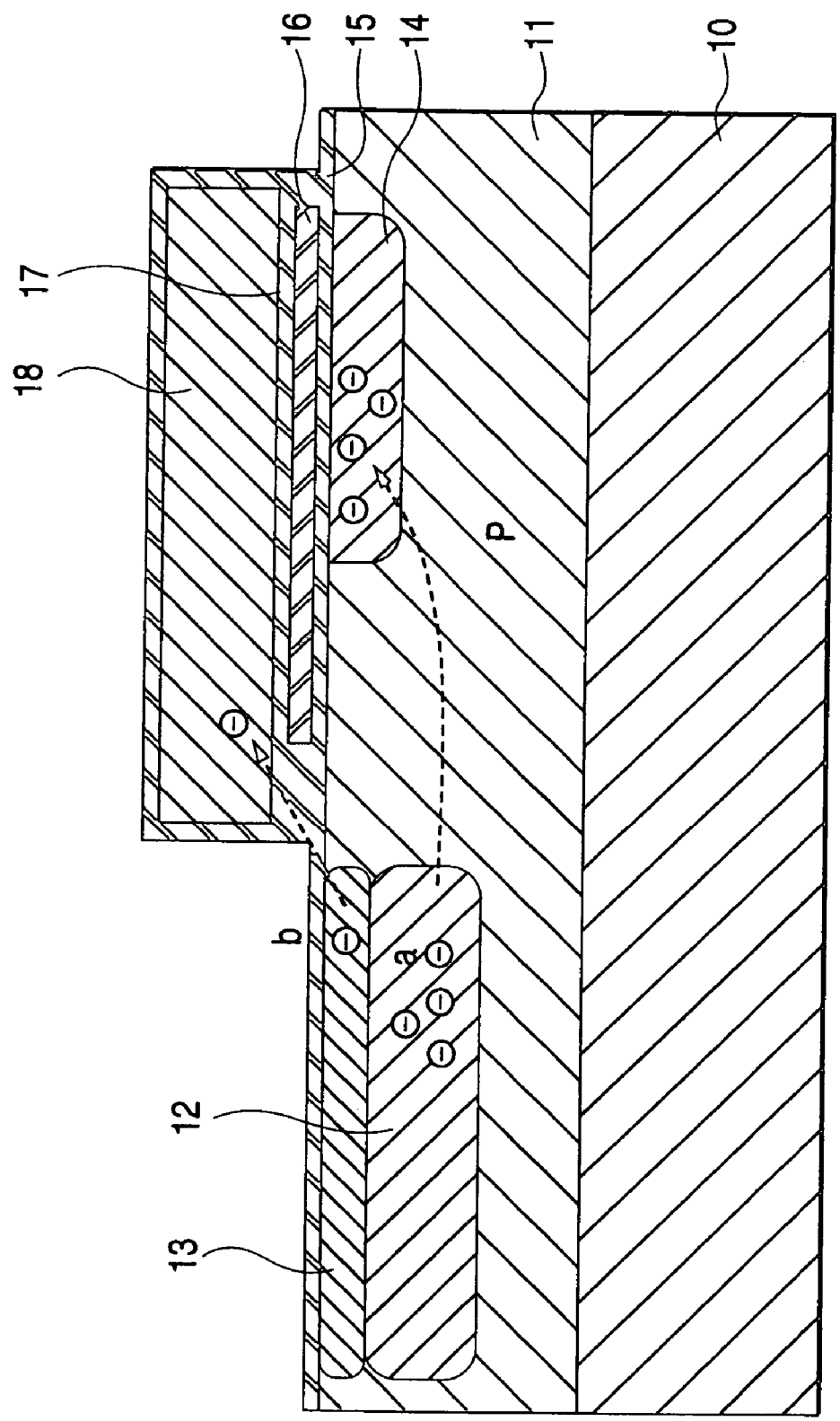
FIG. 1 is a view showing a solid-state image pick-up device according to a first embodiment of the invention.

As shown in a schematic sectional view of FIG. 1, a solid-state image pick-up device is characterized in that a gate electrode 18 to be a charge transfer electrode comprising a polycrystalline silicon film is formed through insulating films 15, 16 and 17 (hereinafter referred to as gate oxide films) having an ONO structure on the surface of a silicon substrate 10, and the gate oxide films provided under the gate electrode 18 have a single layer structure in which the silicon nitride film 16 is not present on an end at the photodiode section side.

Figure 7:
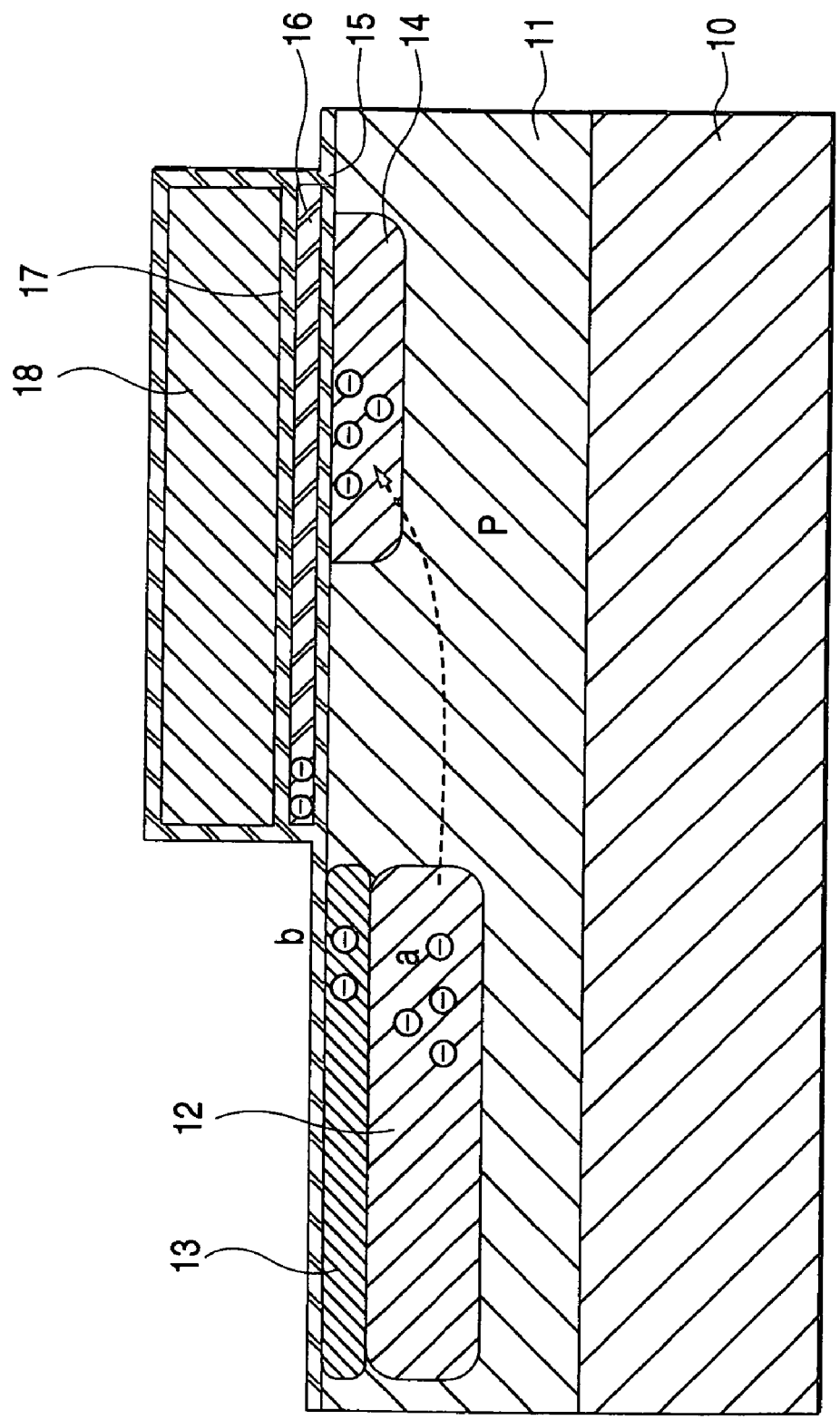
FIG. 7 is a view showing a solid-state image pick-up device according to a related art.

Other portions are formed in the same manner as those in the solid-state image pick-up device according to the conventional example shown in FIG. 7.

Next, a process for manufacturing the solid-state image pick-up device will be described with reference to FIGS. 2(a) to 2(e). In this example, ion implantation is carried out to form an n-type impurity region 12 for forming a photodiode region, a p-type impurity diffusion region 13 and an n-type impurity region 14 to be a transfer channel, and a gate oxide film and a gate electrode are then formed. In this case, on the assumption that a diffusion length is increased by heating at a subsequent step, it is necessary to set a diffusion time. In the following steps, a photodiode region and a transfer channel which are to be formed in a semiconductor substrate will be omitted for simplification.

Figure 2A:
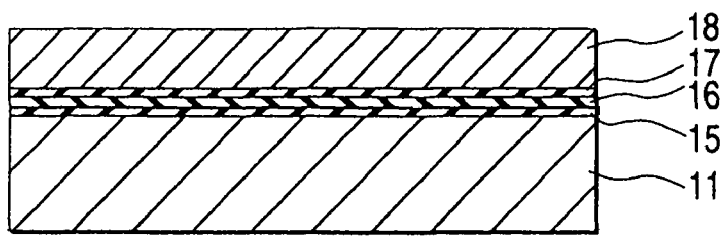
FIGS. 2(a) to 2(e) show the views showing a process for manufacturing the solid-state image pick-up device according to the first embodiment of the invention.

As shown in FIG. 2(a), first of all, the silicon oxide film 15 having a thickness of 15 nm, the silicon nitride film 16 having a thickness of 50 nm and the silicon oxide film 17 having a thickness of 10 nm are formed in a p well 11 provided on the surface of the n-type silicon substrate 10, and a gate oxide film having a three-layer structure is formed.

Subsequently, a high concentration doped polycrystalline silicon film having a thickness of 0.4 μm for forming the gate electrode 18 is provided on the gate oxide film.

Figure 2B:
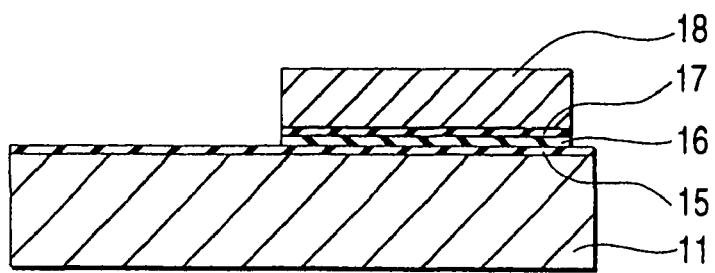

As shown in FIG. 2(b), then, the polycrystalline silicon film is subjected to patterning through reactive ion etching by using, as a mask, a resist pattern formed by photolithography, thereby forming the gate electrode 18 to be a reading gate. Furthermore, the gate oxide films are sequentially etched by using the gate electrode 18 as a mask.

Figure 2C:
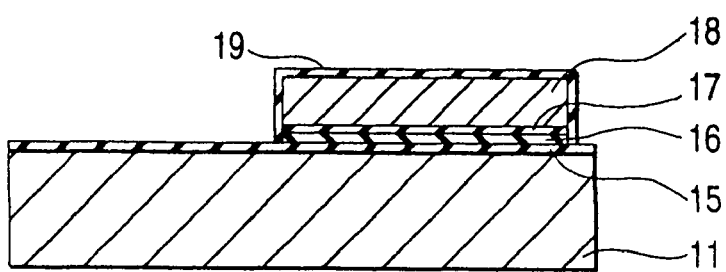

As shown in FIG. 2(c), thereafter, thermal oxidation is carried out to form a thermal oxide film 19 on the surface of the reading gate. At this time, the thermal oxide film 19 is rarely formed on the gate oxide film, that is, the silicon nitride film 16. Accordingly, removal can easily be carried out by an acidic processing.

Figure 2D:
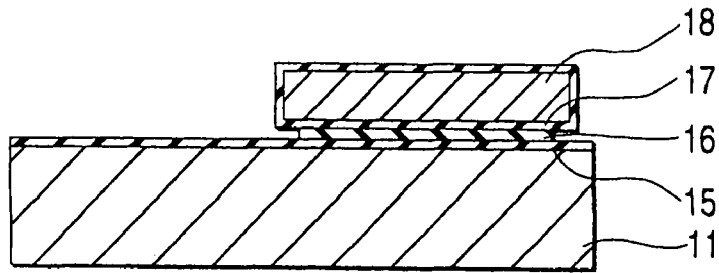

As shown in FIG. 2(d), subsequently, the oxide film provided on the silicon nitride film 16 is removed by the acidic processing, and the silicon nitride film is selectively removed by wet etching using thermal phosphoric acid in a width of approximately 0.2 μm from a reading gate end.

Figure 2E:
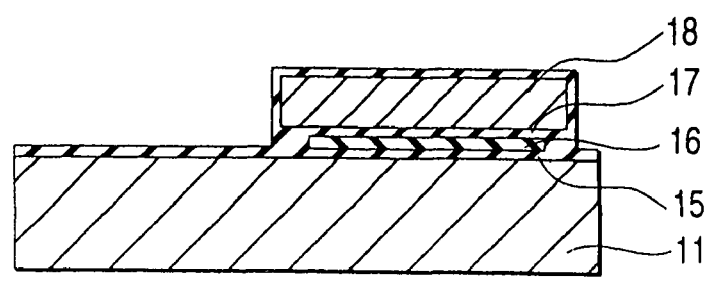

Then, the thermal oxidation is carried out and a region from which the silicon nitride film is removed is filled with a silicon oxide film as shown in FIG. 2(e).

The final step of forming the silicon oxide film is not restricted to the thermal oxidation but a plasma CVD method and a low pressure CVD method may be used. Moreover, the processing may be exactly transferred to subsequent steps.

According to the solid-state image pick-up device thus formed, there is employed a single layer structure in which the gate oxide film provided under the reading gate which is close to the photodiode region does not contain the silicon nitride film on the end, and the silicon nitride film is not present on the end of an electrode on which an electric field converges most greatly in the application of a reading pulse. Even if a signal charge generated in the vicinity of the surface of the substrate is changed into a hot electron, consequently, the hot electron is rarely trapped. Accordingly, it is possible to maintain an excellent reading characteristic without causing the aging of a reading gate voltage.

Moreover, it is also possible to carry out formation without requiring a new photolithographic process by only carrying out isotropic etching over an edge. Thus, a solid-state image pick-up device having an excellent characteristic can be formed very easily with a high workability.

Second Embodiment

Figure 3:
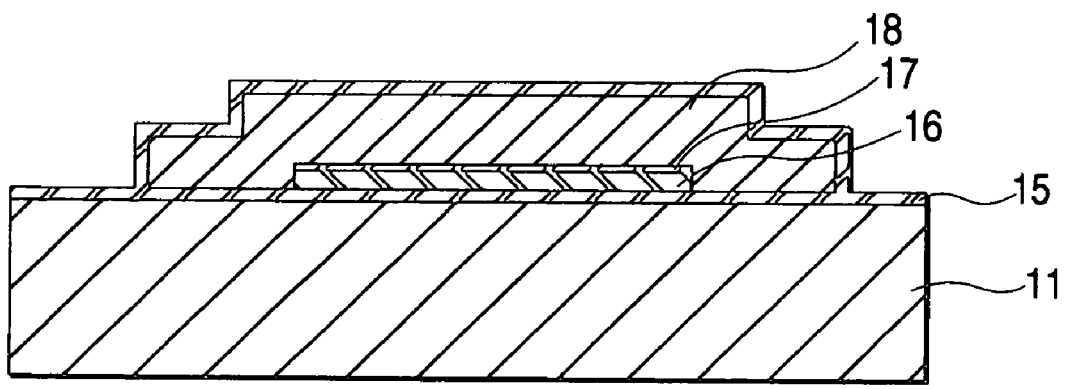
FIG. 3 is a view showing a solid-state image pick-up device according to a second embodiment of the invention.

Next, a second embodiment of the invention will be described with reference to FIG. 3. In the first embodiment, the silicon oxide film 15, the silicon nitride film 16 and the silicon oxide film 17 are formed on the silicon substrate 10, and the polycrystalline silicon film to be the reading gate is formed thereon and is thus subjected to patterning, and the silicon nitride is retreated by side etching using the polycrystalline silicon film as a mask. In the embodiment, the silicon nitride is previously subjected to the patterning and a reading gate is protruded therefrom to surround the edge of the silicon nitride film 16.

More specifically, the silicon oxide film 15, the silicon nitride film 16 and the silicon oxide film 17 are formed and the silicon oxide film 17 and the silicon nitride film 16 are subjected to the patterning, and a reading gate 18 is formed to be protruded from the edge of the silicon nitride film 16. Other portions are formed in the same manner as those of the first embodiment.

With such a structure, similarly, it is possible to prevent a reading voltage from being raised by trapping a hot electron. There is a problem in that another photolithographic step is added in this case.

Third Embodiment

Next, a third embodiment of the invention will be described with reference to FIG. 4. In the second embodiment, the silicon oxide film 15, the silicon nitride film 16 and the silicon oxide film 17 are formed on the silicon substrate 10, and the silicon oxide film 17 and the silicon nitride film 16 are subjected to the patterning to form the gate electrode 18 to be the reading gate so as to be protruded from the edge of the silicon nitride film 16. In the embodiment, the gate oxide film and the gate electrode are sequentially subjected to the patterning in the same manner as in the first embodiment, and a sidewall 20 comprising polycrystalline silicon is then formed on the sidewall of a gate electrode by a sidewall leaving method and the end of the reading gate is substantially protruded outward by the sidewall.

Other portions are also formed in the same manner as those in the first embodiment.

With such a structure, similarly, it is possible to prevent a reading voltage from being raised by trapping a hot electron.

Next, a manufacturing process will be briefly described. FIGS. 5(a) to 5(d) show the manufacturing process. The same formation as that in the first embodiment is carried out until a patterning step shown in FIG. 5(b), and the gate electrode 18 and the gate oxide films 15, 16 and 17 are formed as shown in FIG. 2(b). At this time, the pattern of the gate electrode 18 to be actually the reading gate is formed to be smaller by approximately 0.2 µm than that in the first embodiment.

Figure 5A:
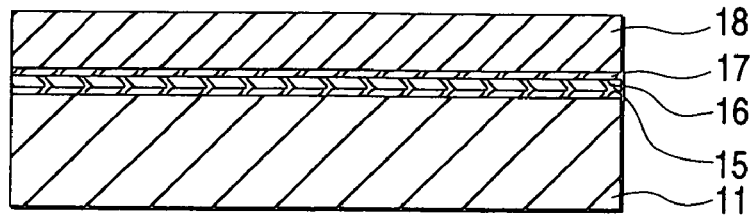
FIGS. 5(a) to 5(d) show the view showing a process for manufacturing the solid-state image pick-up device according to the third embodiment of the invention.
Figure 5B:
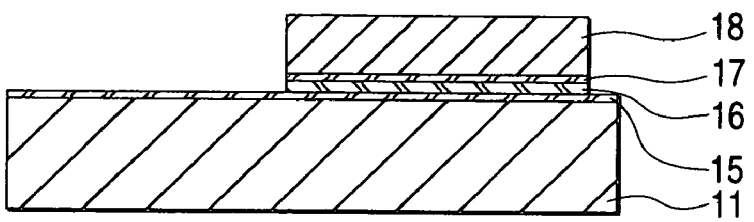
Figure 5C:
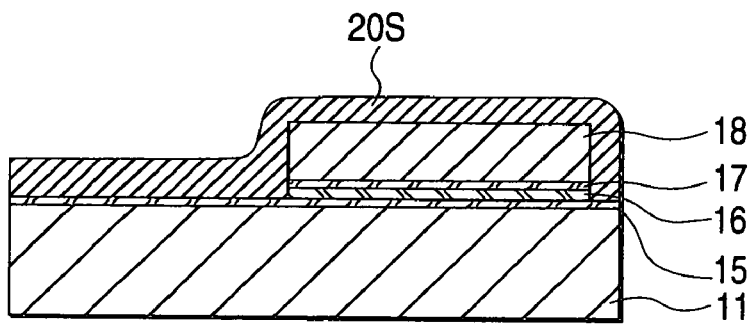

As shown in FIG. 5(c), then, SiH$_4$ is thermally decomposed at 600 to 650□ by a low pressure CVD method, thereby forming a high concentration doped polycrystalline silicon film 4b having a thickness of 0.4 µm.

Figure 5D:
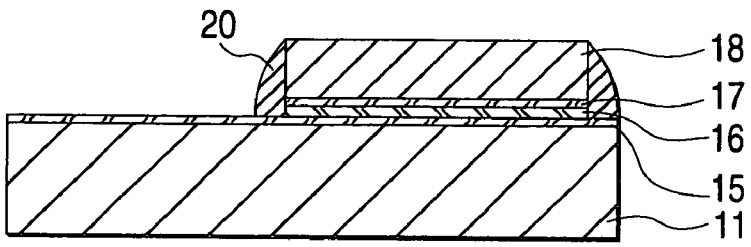

By reactive ion etching having conditions set to have anisotropy, then, a sidewall is left to form the side wall 20 comprising polycrystalline silicon as shown in FIG. 5(d).

Figure 4:
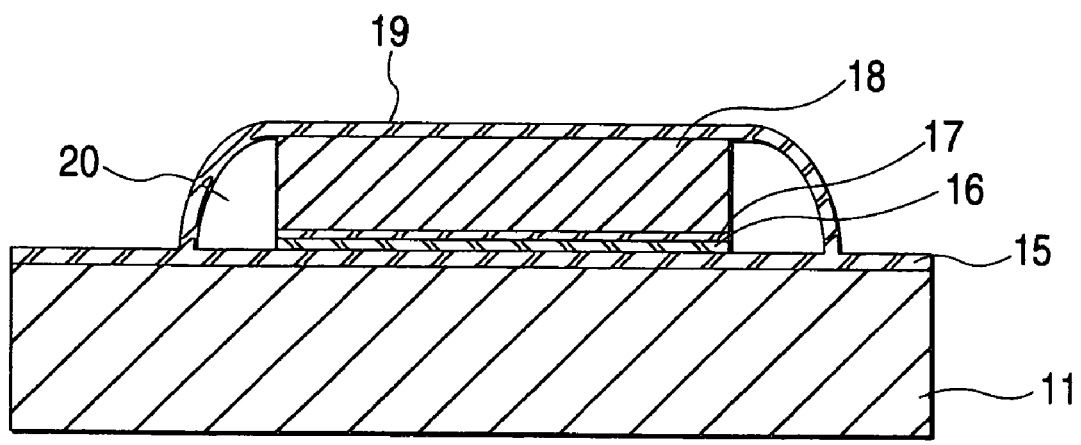
FIG. 4 is a view showing a solid-state image pick-up device according to a third embodiment of the invention.

Thereafter, a surface is oxidized so that a solid-state image pick-up device shown in FIG. 4 is formed.

By this method, similarly, it is possible to employ the same structure as that in the case in which a reading gate is substantially protruded by the presence of the sidewall 20, and a hot electron can be prevented from being trapped into silicon nitride. Thus, it is possible to form a solid-state image pick-up device having a high reliability.

Moreover, the solid-state image pick-up device can be formed by only the low pressure CVD method to be a low temperature step and an anisotropic etching step without increasing a photolithographic step. Consequently, it is possible to provide a solid-state image pick-up device as designed without an increase in a diffusion length.

Fourth Embodiment

Figure 6:
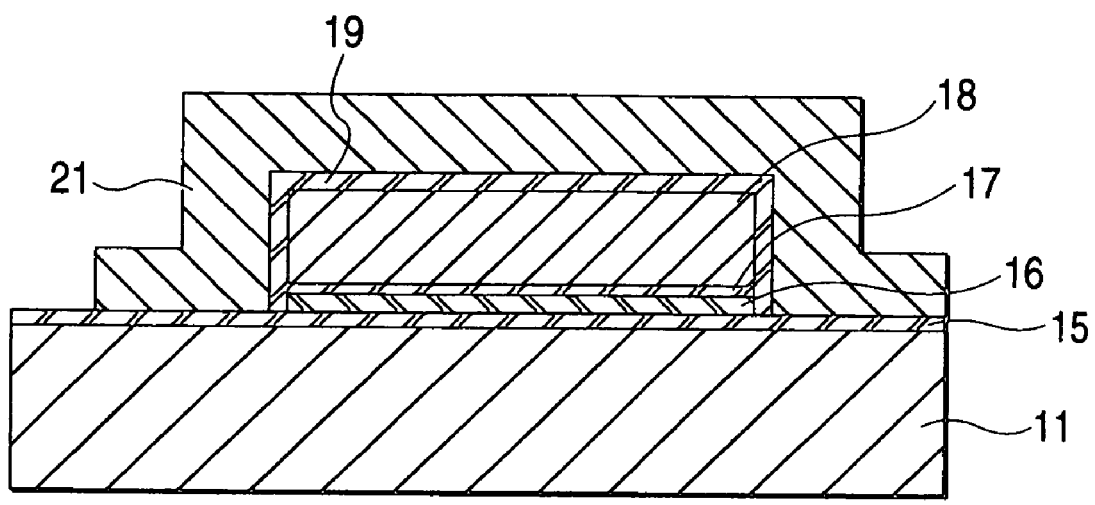
FIG. 6 is a view showing a solid-state image pick-up device according to a fourth embodiment of the invention.

Next, a fourth embodiment of the invention will be described with reference to FIG. 6. In the embodiment, a region to be the end of a reading gate which is formed by the sidewall of polycrystalline silicon in the third embodiment is formed by a shielding electrode 21 comprising a tungsten film for covering the periphery of an original reading gate.

If the tungsten film is desirably formed through tungsten silicide, an adhesion can also be enhanced.

In a manufacturing process, a photolithographic step for defining the edge of the shielding electrode is required in place of anisotropic etching for forming a sidewall. Other portions are formed in the same manner as those in the third embodiment.

In the solid-state image pick-up device, it is very effective to carry out the covering with the shielding film except for a light receiving region in order to prevent a malfunction. With such a structure, effective advantages can be produced in respect of a shielding property and the prevention of trapping of a hot electron.

In the embodiment, the reading gate has been described. In the case in which the reading gate is provided integrally with a transfer gate, it is preferable that silicon nitride provided on the edge of the gate electrode thus integrated should be retreated.

Moreover, while only the edge has a single layer structure in the embodiment, it is also possible to employ a structure in which the whole gate oxide film of the gate electrode such as a reading gate which is the closest to a photoelectric converting section does not contain the silicon nitride.

Furthermore, a polycrystalline silicon film or a metallic film may be used in the shape of the shielding film. In this case, even if the film does not have the shielding property, the function of the electrode 21 can be fulfilled. Moreover, tantalum, titanium, molybdenum and cobalt as well as tungsten may be used for the metallic film.

As described above, the solid-state image pick-up device according to the invention has such a single layer structure that the gate oxide film of the transfer path of a charge coupled device (CCD) which is close to a photoelectric converting section does not contain a silicon nitride film on an end at the photoelectric converting section side, and the silicon nitride film is not present on the end of an electrode on which an electric field converges most greatly in the application of a reading pulse. Consequently, it is possible to maintain an excellent reading characteristic without causing the aging of a voltage to be applied to a reading gate.

According to the invention, moreover, it is possible to very easily provide a method of manufacturing a solid-state image pick-up device having an excellent reading characteristic which does not cause the aging of a gate voltage.

What is claimed is:

1. A method of manufacturing a solid-state image pick-up device, comprising the steps of:

forming a gate oxide film having a lamination structure including at least a silicon nitride film and a silicon oxide film on an insulating film of a surface of a semiconductor substrate;

forming a charge transfer electrode on the gate oxide film;

etching the gate oxide film by using the charge transfer electrode as a mask; and carrying out etching on an etching condition that an etching selective ratio of the silicon nitride film to the silicon oxide film is high, thereby selectively removing an end of the silicon nitride film.

2. The method of manufacturing a solid-state image pick-up device according to claim 1, wherein the selective removing step is a chemical dry etching (CDE) step.

3. The method of manufacturing a solid-state image pick-up device according to claim 1, wherein the selective removing step is an isotropic etching step using phosphoric acid.

4. A method of manufacturing a solid-state image pick-up device, comprising the steps of:

forming a gate oxide film having a lamination structure including at least a silicon nitride film and a silicon oxide film on an insulating film of a surface of a semiconductor substrate;

forming a charge transfer electrode having a sidewall on the gate oxide film;

etching the gate oxide film to form a gate oxide film sidewall adjacent the charge transfer electrode sidewall; and etching the gate oxide film sidewall to form an opening in the silicon nitride layer extending beneath the charge transfer electrode.

5. The method of claim 4 wherein said step of etching the gate oxide film sidewall comprises the step of etching the gate oxide film sidewall using a process wherein the selective ratio of silicon nitride film to silicon oxide film is high.

6. The method of claim 4 wherein said step of etching the gate oxide film sidewall comprises the step of selectively etching the silicon nitride portion of the gate oxide film sidewall.

7. The method of claim 4 including the additional step of filling the opening with silicon oxide.

8. The method of claim 4 wherein said step of etching the gate oxide film to form a gate oxide film sidewall comprises the step of etching the gate oxide film using the charge transfer electrode as a mask.

9. The method of claim 4, wherein said step of etching the gate oxide film sidewall comprises the step of chemical dry etching (CDE) the gate oxide film sidewall.

10. The method of claim 4 wherein said step of etching the gate oxide film sidewall comprises the step of isotropically etching the gate oxide film sidewall using phosphoric acid.

* * * * *